United States Patent [19]
Park

[11] Patent Number: 5,994,930
[45] Date of Patent: Nov. 30, 1999

[54] FREQUENCY MULTIPLIER FOR CONTROLLING PULSE WIDTH WITHIN A PRESCRIBED RANGE

[75] Inventor: Yong-In Park, Seoul, Rep. of Korea

[73] Assignee: LG Semicon Co., Ltd., Cheongju, Rep. of Korea

[21] Appl. No.: 08/988,558

[22] Filed: Dec. 11, 1997

[30] Foreign Application Priority Data

Dec. 23, 1996 [KR] Rep. of Korea ...................... 96/70189

[51] Int. Cl.⁶ ................................................. H03B 19/00
[52] U.S. Cl. ............................ 327/116; 327/119; 327/122
[58] Field of Search ............................ 327/116, 119–122, 327/355, 356, 358, 359; 377/47, 48

[56] References Cited

U.S. PATENT DOCUMENTS

| | | | |
|---|---|---|---|
| 5,010,561 | 4/1991 | Itoh | 327/116 |
| 5,297,179 | 3/1994 | Tatsumi | 327/122 |
| 5,514,990 | 5/1996 | Mukaine et al. | 327/116 |

FOREIGN PATENT DOCUMENTS

| | | | |
|---|---|---|---|
| 63-237610 | 10/1988 | Japan | 327/116 |
| 3-136515 | 6/1991 | Japan | 327/116 |

OTHER PUBLICATIONS

Woeste, Dana et al., "FA 8.4: Digital–Phase Aligner Macro for Clock Tree Compensation with 70ps Jitter", 1996 IEEE International Solid–State Circuits Conference, Feb. 9, 1966, pp. 136–137.

*Primary Examiner*—Kenneth B. Wells
*Attorney, Agent, or Firm*—Fleshner & Kim

[57] ABSTRACT

A frequency multiplier for controlling a pulse width maintains a desired pulse width irrespective of a semiconductor fabrication process variation. The multiplier includes a delay unit for delaying an input signal and an exclusive OR-gate for exclusively ORing the delayed signal from the delay unit and the input signal. The multiplier further includes inverters that sequentially invert the signal from the exclusive OR-gate and a low-pass filter that filters the signal from the exclusive OR-gate. A high electric potential comparator and low electric potential comparator are for comparing the signal from the low-pass filter with first and second voltage limits to output first and second switch control signals to the delay unit, respectively.

20 Claims, 4 Drawing Sheets

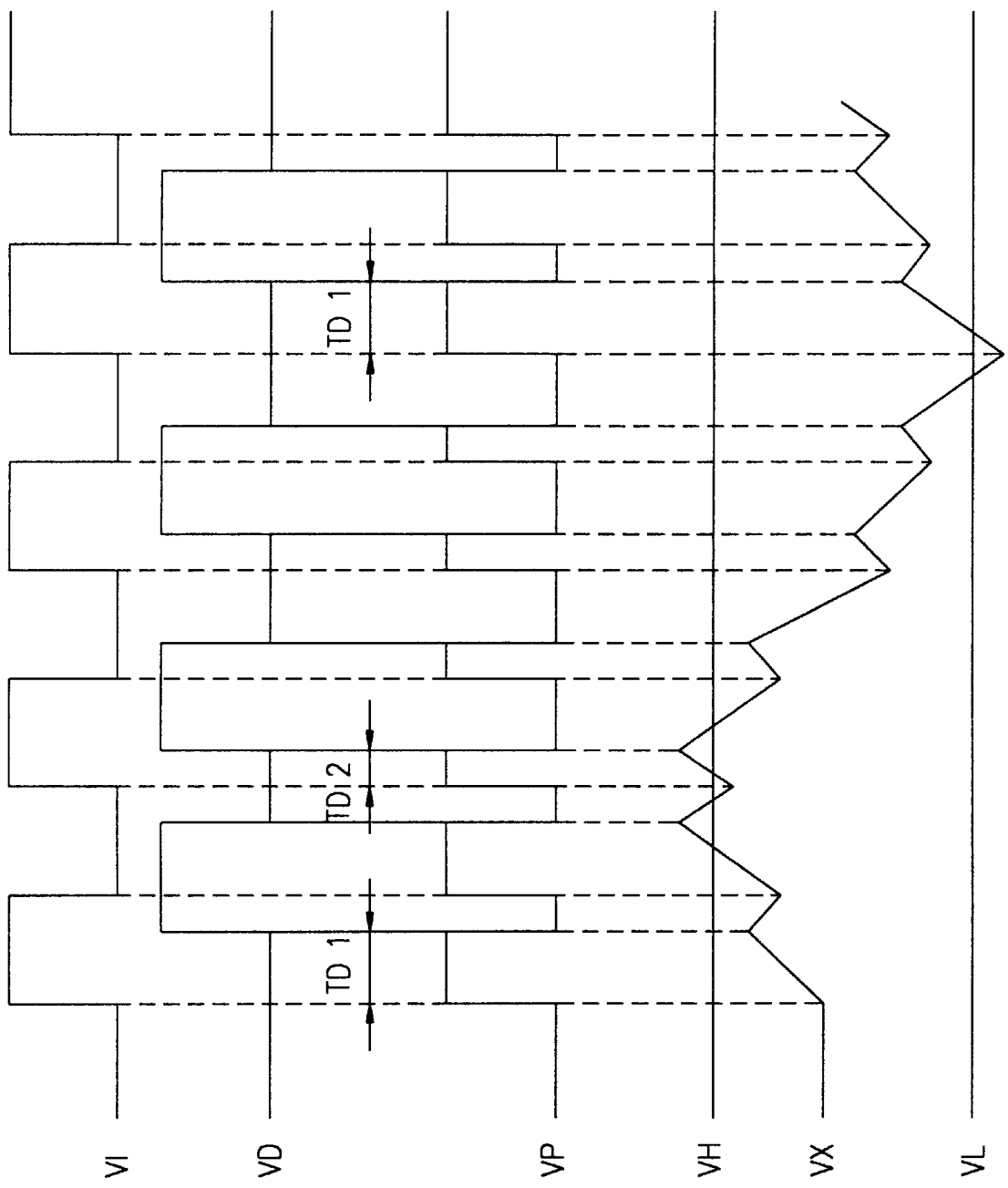

FREQUENCY MULTIPLIER FOR CONTROLLING PULSE WIDTH WITHIN A PRESCRIBED RANGE

BACKGROUND OF THE INVENTION

1. Field of the Invention

The present invention relates to a frequency multiplier for controlling a pulse width, and in particular, to a frequency multiplier for controlling a pulse width that maintains a prescribed pulse width.

2. Background of the Related Art

FIG. 1 illustrates a related art frequency multiplier. Delay units D1, . . . , DN delay respectively an input signal VI at different delay ratios, and a multiplexor 1 selectively outputs a corresponding one of delay speeds TD 1, . . ., TD N of the delay units D1, . . . , DN. An exclusive OR-gate 2 exclusively ORs an output signal from the multiplexor 1 and the input signal VI.

The delay units D ,. . ., DN having different delay ratios delay the input signal VI to output delayed signals having the delay speeds TD 1,. . ., TD N to the multiplexor 1. The multiplexor 1 selects one of the delay speeds TD1, . . ., TD N of the delay units D1, . . . DN and outputs the delay speed. The OR-gate 2 exclusively ORs the output signal from the multiplexor 1 and the input signal VI.

Therefore, an output signal VO from the exclusive OR-gate 2 has a different pulse width based on the delay ratios of the delay units D1, . . . , DN. However, the related art frequency multiplier has various disadvantages. The related art frequency multiplier uses a plurality of delay devices. In addition, an accurate delay ratio is required for the delay units to maintain the pulse width having a predetermined range. If the delay ratio of the delay device varies based on semiconductor fabrication process variations, it is not possible to maintain the pulse width within the predetermined range.

SUMMARY OF THE INVENTION

An object of the present invention is to provide a frequency multiplier that substantially overcomes at least one of the aforementioned problems and disadvantages of the related art.

Another object of the present invention is to provide a predetermined pulse width regardless of semiconductor fabrication process variations.

A further object of the present invention is to provide a frequency multiplier that uses a single delay device.

To achieve at least the above objects in a whole or in parts, there is provided a frequency multiplier according to the present invention for controlling a pulse width that includes a delay circuit that delays a first signal; a logic circuit that logically processes the delayed first signal from the delay circuit and the first signal to output a second signal; a low-pass filter that filters the second signal from the logic circuit to output a filtered second signal; and first and second comparators that respectively compare the filtered signal with first and second voltage levels to output first and second switch control signals to the delay circuit.

To further achieve the above objects according to the present invention, there is provided a semiconductor device that generates a signal having a prescribed pulse width including a delay circuit that delays a first signal; a logic circuit that logically processes the delayed first signal from the delay circuit and the first signal to output a second signal; a pulse width detection device that receives the second signal from the logic circuit and outputs a pulse width detection signal; a pulse width correction device that compares the pulse width detection signal with a prescribed signal to output control signals to the delay circuit; and first and second comparators that respectively compare the filtered signal with first and second voltage levels to output first and second switch control signals to the delay circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 6A–6D are diagrams illustrating signal timing of FIG. 2.

DETAILED DESCRIPTION OF PREFERRED EMBODIMENTS

Figure 1:
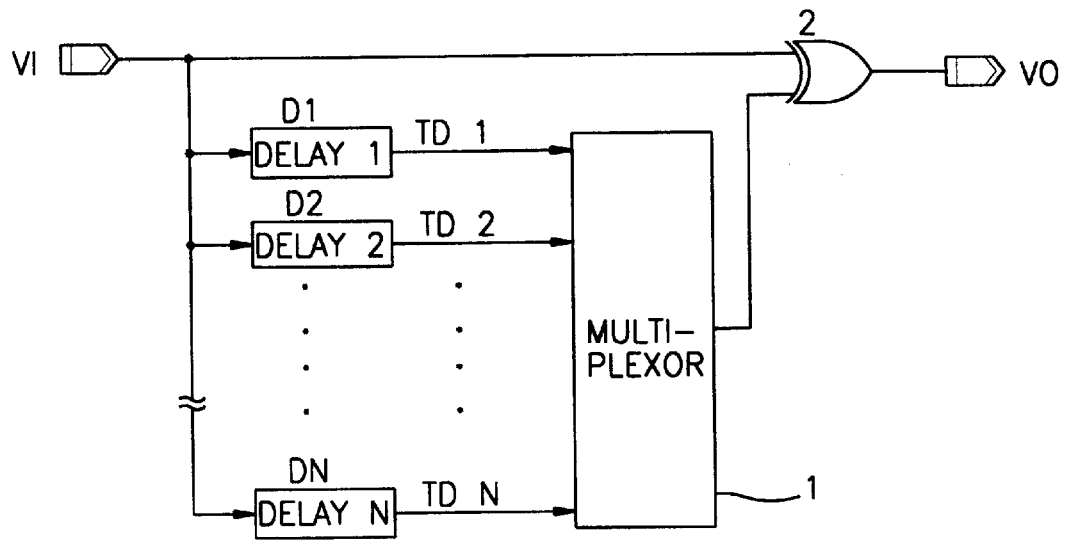
FIG. 1 is a block diagram illustrating a related art frequency multiplier.
Figure 2:
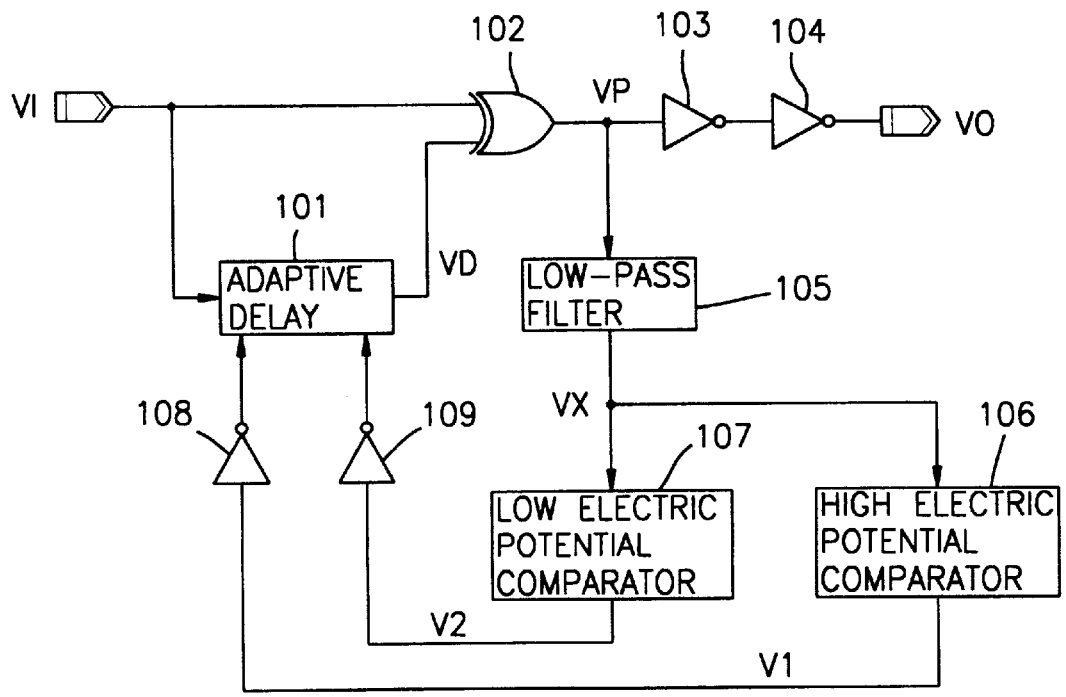
FIG. 2 is a block diagram illustrating one preferred embodiment of a frequency multiplier according to the present invention.

FIG. 2 illustrates a preferred embodiment of a frequency multiplier for controlling a pulse width according to the present invention. An adaptive delay unit 101 delays an input signal VI by a predetermined time, and an exclusive OR-gate 102 exclusively ORs a delayed signal VD output by the adaptive delayed unit 101 and the input signal VI. Inverters 103, 104 sequentially invert an output signal VP from the exclusive OR-gate 102. The inverters 103, 104 are coupled in series.

The frequency multiplier further includes a low pass filter 105, high and low electric potential comparators 106, 107 and inverters 108, 109. The low-pass filter 105 filters the output signal VP from the exclusive OR-gate 102 and outputs a pulse width detection signal VX. The high electric potential comparator 106 and the low electric potential comparator 107, respectively, compare the pulse width detection signal VX from the low-pass filter 105 with an upper limit voltage VH and a lower limit voltage VL to respectively output switch control signals V1 and V2. The inverters 108, 109 respectively invert the switch control signal V1 from the high electric potential comparator 106 and the switch control signal V2 from the low electric potential comparator 107 and output inverted signals /V1 and /V2 to the adaptive delay unit 101.

Figure 3:
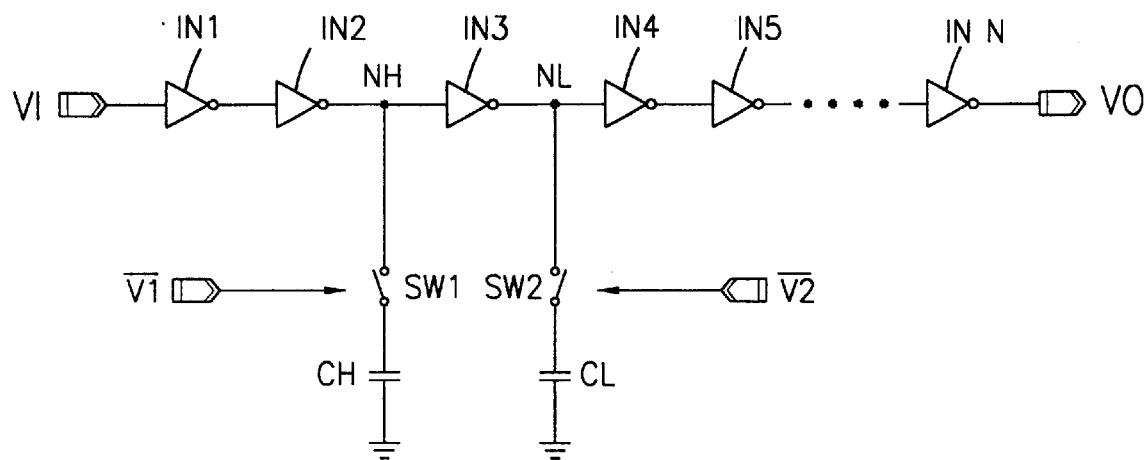
FIG. 3 is a circuit diagram illustrating an adaptive delay unit of FIG. 2.

As shown in FIG. 3, the adaptive delay unit 101 includes series coupled inverters IN1, . . . , IN N, a load capacitor CH coupled through a first switch SW2 to a node NH and to ground, and a load capacitor CL coupled through a second switch SW2 to a node NL and to the ground. The node NH is preferably between inverters IN2 and IN3 and the node NL is preferably between inverters IN3 and IN4. Thus, the node NH is high level and the node NL is low level when an input signal is high level. The first switch SW1 is switched in accordance with the signal /V1 and the second switch SW2 switched in accordance with the signal /V2.

Figure 4:
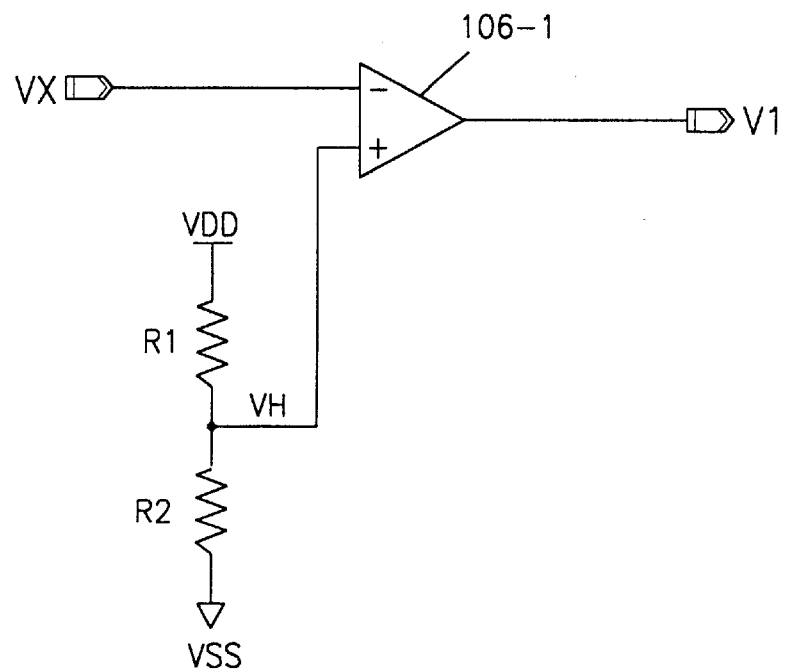
FIG. 4 is a circuit diagram illustrating a first electric potential comparator of FIG. 2.

As shown in FIG. 4, the high electric potential comparator 106 includes resistors R1 and R2 coupled in series between a supply voltage VDD and a ground voltage VSS to divide the supply voltage VDD and provide a divided upper limit voltage VH. The high electric potential comparator 106 further includes a comparator 106-1 for comparing the pulse width detection signal VX from the low-pass filter 105 received through a non-inversion terminal with the divided upper limit voltage VH received through the inversion terminal.

Figure 5:
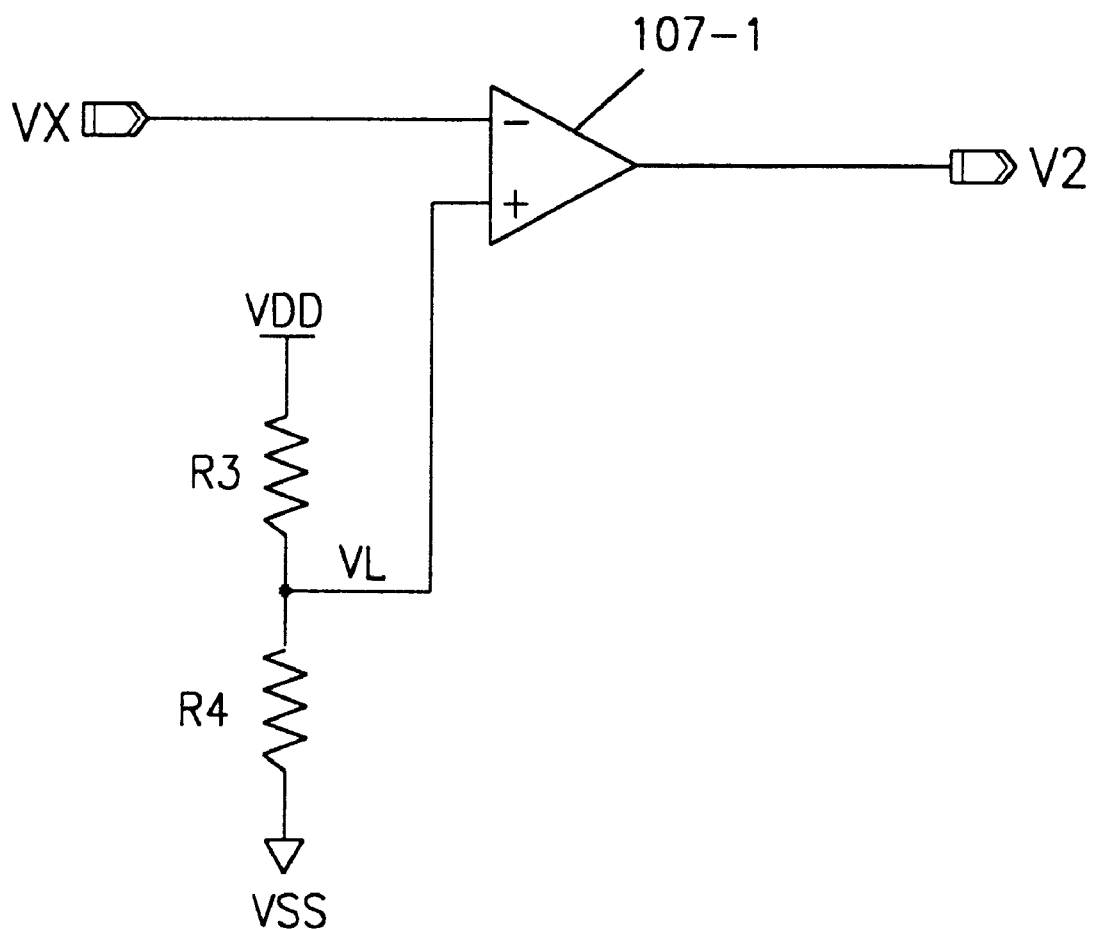
FIG. 5 is a circuit diagram illustrating another electric potential comparator of FIG. 2.

As shown in FIG. 5, the low electric potential comparator 107 includes resistors R3 and R4 coupled between the supply voltage VDD and the ground voltage VSS to divide the supply voltage VDD and determine a divided lower limit voltage VL. The low electric potential comparator 107 further includes a comparator 107-1. The comparator 107-1 compares the pulse width detection signal VX from the low-pass filter 105 received through the non-inversion terminal with the divided lower limit voltage VL received through the inversion terminal.

Operations of the preferred embodiment of the frequency multiplier will now be described. As shown in FIG. 6A, if the input signal VI is inputted to the adaptive delay unit 101, the delay signal VD, which was delayed more than the input signal VI by as much as the delay speeds TD1 and TD2 shown in FIG. 6B, is outputted by the switches SW1 and SW2 and the load capacitors CH and CL coupled to the inverter chain having inverters IN1, . . . , IN N.

The exclusive OR-gate 102 exclusively ORs the delay signal VD and the input signal VI and outputs an output signal VP having a pulse width as shown in FIG. 6C. The output signal VP from the exclusive OR-gate 102 is then sequentially and invertingly outputted through the inverters 103 and 104. The pulse width of the output signal VP is the delay ratios TD1 and TD2 of the adaptive delay unit 101. For example, as shown in FIG. 6C, the frequency becomes double the input signal VI.

In addition, the low-pass filter 105 charges and discharges the output signal VP from the exclusive OR-gate 102 to output the pulse width detection signal VX shown in FIG. 6D. The low pass filter outputs the pulse width detection signal VX to the high electric potential comparator 106 and the low electric potential comparator 107, respectively.

The comparator 106-1 of the high electric potential comparator 106 receives the pulse width detection signal VX through the inversion terminal, and the upper limit voltage VH, which was divided by the resistors R1 and R2, through the non-inversion terminal, and outputs the switch control signal V1. The comparator 106-1 outputs a high electric potential switch control signal V1 if VX<VH, and outputs a low electric potential switch control signal if VX>VH. The divided upper limit voltage VH can be expressed as follows:

$$VH = \frac{R2}{R1 + R2} \times VDD.$$

The comparator 107-1 of the low electric potential comparator 107 receives the pulse width detection signal VX through the non-inversion terminal and the lower limit voltage VL, which was divided by the resistors R3 and R4, through the inversion terminal to output a switch control signal V2. The comparator 107-1 outputs a high electric potential switch control signal V2 if VX>VL, and outputs a low electric potential switch control signal V2 if VX<VL. The divided lower limit voltage VL can be expressed as follows:

$$VL = \frac{R4}{R3 + R4} \times VDD.$$

As the pulse width of the output signal VP from the exclusive OR-gate 102 becomes widened, if the level of the pulse width detection signal VX from the low-pass filter 105 shown in FIG. 6D exceeds a predetermined level being the upper limit voltage VH, the switch control signal V1 from the high electric potential comparator 106 becomes low electric potential. Thus, output signal /V1 inverted by the inverter 108 becomes high electric potential, and the first switch SW1 of the adaptive delay unit 101 is closed.

Since a path is formed between the node NH and the ground, the delay ratio of the delay signal VD is decreased by the load capacitor CH. Accordingly, the pulse width of the output signal VP from the exclusive OR-gate 102 becomes narrowed limited by the delay speed TD2.

As the pulse width of the output signal VP from the exclusive OR-gate 102 is continuously narrowed, the level of the pulse width detection signal VX from the low-pass filter 105 is lowered below the lower limit voltage VL. Then, the switch control signal V2 from the low electric potential comparator 107 becomes low electric potential. Thus, the output signal /V2 inverted by the inverter 109 becomes high electric potential, and then the second switch SW2 of the adaptive delay unit 101 is closed. Since a path is formed between the node NL and the ground voltage VSS, the delay ratio is increased due to the load capacitor CL, and the pulse width of the output signal VP from the exclusive OR-gate 102 is widened as much as the delay speed TD1.

As described above, the preferred embodiment of the frequency multiplier for controlling a pulse width according to the present invention maintains a desired pulse width range by using resistance ratios of R1:R2 and R3:R4 even when the delay ratio is varied by the semiconductor fabrication process variation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A frequency multiplier for controlling a pulse width, comprising:
    a delay circuit that delays a first signal;
    a logic circuit that logically processes the delayed first signal from the delay circuit and the first signal to output a second signal;
    a filter that filters the second signal from the logic circuit to output a filtered second signal; and
    a comparator unit that respectively compares the filtered signal with first and second voltage levels to output first and second switch control signals to the delay circuit.

2. The frequency multiplier of claim 1, further comprising first and second inverters that respectively invert the first and second switch signals, wherein the inverted switch signals are output to the delay circuit.

3. The frequency multiplier of claim 1, further comprising inverters for sequentially inverting the second signal to output the pulse width.

4. The frequency multiplier of claim 1, wherein said filter is a low-pass filter.

5. The frequency multiplier of claim 1, wherein the logic circuit is a logic-gate.

6. The frequency multiplier of claim 1, wherein the logic circuit is an exclusive-OR gate.

7. The frequency multiplier of claim 1, wherein said comparator unit includes a high electric potential comparator and a low electric potential comparator.

8. The frequency multiplier of claim 1, wherein the delay circuit comprises:

a plurality of inverters coupled in series, wherein a first node is between second and third inverters of the plurality of inverters;

a first switch coupled to the first node;

a first capacitor coupled between the first switch and a reference voltage, wherein the first switch is switched based on the first switch signal;

a second switch coupled to a second node between the third and fourth inverters and the first reference voltage; and a second capacitor coupled between the second switch and the reference voltage, wherein the second switch is switched based on the second switch signal.

9. The frequency multiplier of claim 1, wherein said comparator unit includes a first comparator having:

first and second resistors coupled in series between a second reference voltage and a first reference voltage, wherein the first and second resistors divide the second reference voltage to output an upper voltage level signal; and a first comparator that compares the filtered second signal from the filter and the upper voltage level signal to output the first switch signal.

10. The frequency multiplier of claim 9, wherein the second filtered signal is input through an inversion terminal and the upper voltage level signal is input through a non-inversion terminal of the first comparator, and wherein the first reference voltage is ground and the second reference voltage is a supply voltage.

11. The frequency multiplier of claim 1, wherein the comparator unit includes a second comparator having:

third and fourth resistors coupled in series between a second reference voltage and a first reference voltage, wherein the third and fourth resistors divide the second reference voltage to output a low voltage level signal; and a second comparator that compares the filtered second signal from the filter and the low voltage level signal to output the second switch signal.

12. The frequency multiplier of claim 11, wherein the filtered second signal is input through a non-inversion terminal and the low voltage level signal is input through an inversion terminal.

13. A semiconductor device that generates a signal having a prescribed pulse width, comprising:

a delay circuit that delays a first signal;

a first logic circuit that logically processes the delayed first signal from the delay circuit and the first signal to output a second signal;

a pulse width detection device that receives the second signal from the logic circuit and outputs a pulse width detection signal;

a pulse width correction device that compares the pulse width detection signal with a prescribed signal to output control signals to the delay circuit; and second and third logic circuits that each logically process one of the control signals, respectively, wherein output signals of the second and third logic circuits are switch signals output to the delay circuit.

14. The semiconductor device of claim 13, wherein the pulse width detection device is a low-pass filter that filters the second signal from the first logic circuit to output a filtered second signal.

15. The semiconductor device of claim 14, wherein the pulse width correction device comprises first and second comparators that respectively compare the filtered second signal with first and second voltage levels to output first and second switch control signals to the delay circuit.

16. The semiconductor device of claim 15, wherein said first comparator comprises:

first and second resistors coupled in series between a second reference voltage and a first reference voltage, wherein the first and second resistors divide the second reference voltage to output the first voltage level; and a first comparator that compares the filtered second signal from the low-pass filter and the first voltage level to output the first switch signal, wherein the filtered second signal is input through an inversion terminal and the first voltage level is input through a non-inversion terminal of the first comparator, wherein the first reference voltage is ground and the second reference voltage is a supply voltage, wherein the first voltage level is an upper voltage level, and wherein the first resistor is variable.

17. The semiconductor device of claim 13, wherein the second and third logic circuits are respectively first and second inverters that respectively invert the control signals, wherein first and second inverted signals are the switch signals output to the delay circuit.

18. The semiconductor device of claim 13, further comprising inverters for sequentially inverting the second signal to output the pulse width.

19. The semiconductor device of claim 13, wherein the prescribe pulse width is substantially constant regardless of semiconductor fabrication process variations.

20. A semiconductor device that generates a signal having a prescribed pulse width, comprising:

a delay circuit that delays a first signal wherein the delay circuit comprises, a plurality of inverters coupled in series, a first switch coupled to an input of an even numbered inverter of the plurality of inverters, a first capacitor coupled between the first switch and a reference voltage, wherein the first switch is switched based on a first control signal, a second switch coupled to an input of an odd numbered inverter of the plurality of inverters and the first reference voltage, and a second capacitor coupled between the second switch and the reference voltage, wherein the second switch is switched based on a second control signal;

a logic circuit that logically processes the delayed first signal from the delay circuit and the first signal to output a second signal;

a pulse width detection device that receives the second signal from the logic circuit and outputs a pulse width detection signal; and a pulse width correction device that compares the pulse width detection signal with a prescribed signal to output control signals to the delay circuit.

* * * * *